US012779583B2

(12) United States Patent
Nomura et al.

(10) Patent No.: US 12,779,583 B2
(45) Date of Patent: Nov. 3, 2026

(54) LASER BEAM IRRADIATING APPARATUS

(71) Applicant: DISCO CORPORATION, Tokyo (JP)

(72) Inventors: Teppei Nomura, Tokyo (JP); Yuki Ikku, Tokyo (JP); Satoshi Kobayashi, Tokyo (JP)

(73) Assignee: DISCO CORPORATION, Tokyo (JP)

(*) Notice: Subject to any disclaimer, the term of this patent is extended or adjusted under 35 U.S.C. 154(b) by 865 days.

(21) Appl. No.: 18/158,496

(22) Filed: Jan. 24, 2023

(65) Prior Publication Data

US 2023/0241714 A1 Aug. 3, 2023

(30) Foreign Application Priority Data

Jan. 28, 2022 (JP) ................................. 2022-012319

(51) Int. Cl.
*B23K 26/067* (2006.01)
*B23K 26/062* (2014.01)
(Continued)

(52) U.S. Cl.
CPC .......... *B23K 26/067* (2013.01); *B23K 26/062* (2015.10); *B23K 26/064* (2015.10);
(Continued)

(58) Field of Classification Search
CPC ............ B23K 26/0648; B23K 26/0652; B23K 26/067; B23K 26/0673; B23K 26/0676;
(Continued)

(56) References Cited

U.S. PATENT DOCUMENTS 6,108,087 A * 8/2000 Nikoonahad ........ G01N 29/348 356/511
7,589,843 B2 * 9/2009 Aiyer ................. G01B 11/0675 356/485
(Continued)

FOREIGN PATENT DOCUMENTS

CN 104078339 A * 10/2014 ......... B23K 26/0652
JP 2000218383 A 8/2000
(Continued)

OTHER PUBLICATIONS

Office Action issued in counterpart JP Patent Application No. 2022-012319, dated Jul. 29, 2025.
(Continued)

*Primary Examiner* — Alain Chau
(74) *Attorney, Agent, or Firm* — Greer, Burns & Crain, Ltd

(57) ABSTRACT

A laser beam irradiating apparatus includes a laser oscillator configured to emit a laser beam, a first polarization beam splitter configured to separate the laser beam into a first laser beam of s-polarized light and a second laser beam of p-polarized light, a first spatial light modulator configured to modulate the first laser beam according to a phase pattern, and emit the resulting first laser beam, a second spatial light modulator configured to modulate the second laser beam according to a phase pattern, and emit the resulting second laser beam; a second polarization beam splitter configured to synthesize the first laser beam emitted from the first spatial light modulator and the second laser beam emitted from the second spatial light modulator, and an imaging unit configured to image the synthesized laser beam, and irradiate a target object with the resulting laser beam.

7 Claims, 7 Drawing Sheets

(51) Int. Cl.

| | |
|---|---|
| ***B23K 26/064*** | (2014.01) |
| ***B23K 101/40*** | (2006.01) |
| ***B23K 103/00*** | (2006.01) |
| ***H10W 72/00*** | (2026.01) |

(52) U.S. Cl.

CPC ...... *B23K 26/0643* (2013.01); *B23K 26/0648* (2013.01); *B23K 26/0652* (2013.01); *B23K 26/0676* (2013.01); *B23K 2101/40* (2018.08); *B23K 2103/56* (2018.08); *H10W 72/07141* (2026.01)

(58) Field of Classification Search

CPC ............ B23K 26/0743; B23K 2103/56; H01L 21/76894; H01L 21/263; H01L 21/2633; H01L 21/268

See application file for complete search history.

(56) References Cited

U.S. PATENT DOCUMENTS

| | | | | | |
|---|---|---|---|---|---|
| 8,148,211 | B2 * | 4/2012 | Bruland | H01L 21/76894 | 219/68 |
| 9,784,980 | B2 * | 10/2017 | Inoue | G02B 27/283 | |
| 2004/0207850 | A1 * | 10/2004 | Kwak | G01N 21/636 | 356/432 |
| 2005/0282407 | A1 * | 12/2005 | Bruland | B23K 26/067 | 438/795 |
| 2007/0070357 | A1 * | 3/2007 | Aiyer | G01B 11/0675 | 356/485 |
| 2016/0062128 | A1 * | 3/2016 | Inoue | B23K 26/067 | 349/25 |
| 2017/0087663 | A1 * | 3/2017 | Onoe | H01L 21/68714 | |
| 2020/0114473 | A1 * | 4/2020 | Hyakumura | B23K 26/0673 | |

FOREIGN PATENT DOCUMENTS

| | | | | | |
|---|---|---|---|---|---|
| JP | 3922686 | B | | 5/2007 | |
| JP | 2010260063 | A | * | 11/2010 | B23K 26/06 |
| JP | 2011051011 | A | | 3/2011 | |
| JP | 2017-064743 | A | | 4/2017 | |
| JP | 2020127950 | A | | 8/2020 | |
| JP | 2021102217 | A | | 7/2021 | |
| JP | 2021115613 | A | * | 8/2021 | B23K 26/00 |
| KR | 20160132227 | A | * | 11/2016 | B23K 26/064 |
| KR | 20170041516 | A | * | 4/2017 | B23K 26/00 |

OTHER PUBLICATIONS

Office Action issued in counterpart JP Patent Application No. 2022-012319, dated Dec. 9, 2025.

* cited by examiner

LASER BEAM IRRADIATING APPARATUS

BACKGROUND OF THE INVENTION

Field of the Invention

The present invention relates to a laser beam irradiating apparatus.

Description of the Related Art

A laser beam irradiating apparatus that irradiates a target object with a laser beam is known (see, for example, Japanese Patent Laid-Open No. 2011-51011 and Japanese Patent Laid-Open No. 2021-102217). In such a laser beam irradiating apparatus, the laser beam generated by a laser oscillator is modulated by a spatial light modulator, and is then condensed onto the target object by an objective lens.

SUMMARY OF THE INVENTION

In the laser beam irradiating apparatus described above, increasing energy of the laser beam applied to the target object makes it possible to perform processing efficiently by increasing the number of branches of the laser beam or increase irradiated regions while maintaining energy density. There is thus a strong desire for higher output power of the laser oscillator.

A laser oscillator of high output power usually provides randomly polarized light. In addition, the laser beam incident on the spatial light modulator needs to be linearly polarized light.

Hence, in a case where a laser oscillator of high output power is applied to the laser beam irradiating apparatus described above, the laser beam emitted from the laser oscillator is separated into p-polarized light and s-polarized light by making the laser beam incident on a polarization beam splitter (PBS), and a laser beam of one polarized component is guided to the spatial light modulator and modulated by the spatial light modulator, and is then applied to the target object.

At this time, in the laser beam irradiating apparatus, a laser beam of another polarized component is not used but is discarded. Thus, the energy of the laser beam applied to the target object is halved, so that the laser beam cannot be used efficiently.

It is accordingly an object of the present invention to provide a laser beam irradiating apparatus that can efficiently irradiate a target object with a laser beam emitted from a laser oscillator.

In accordance with an aspect of the present invention, there is provided a laser beam irradiating apparatus for irradiating a target object with a laser beam. The laser beam irradiating apparatus includes a laser oscillator configured to emit the laser beam, a first polarization beam splitter configured to separate polarized components of the laser beam emitted from the laser oscillator into p-polarized light and s-polarized light, a first spatial light modulator on which one polarized component separated by the first polarization beam splitter is made incident, and that is configured to modulate the incident laser beam according to a phase pattern, and emit the resulting laser beam, a second spatial light modulator on which another polarized component separated by the first polarization beam splitter is made incident, and that is configured to modulate the incident laser beam according to a phase pattern, and emit the resulting laser beam, a second polarization beam splitter configured to synthesize the laser beam emitted from the first spatial light modulator and the laser beam emitted from the second spatial light modulator, by transmitting the laser beam emitted from the first spatial light modulator, and reflecting the laser beam emitted from the second spatial light modulator, and an imaging unit configured to image the laser beam synthesized by the second polarization beam splitter, and irradiate the target object with the resulting laser beam.

Preferably, the laser beam irradiating apparatus further includes a first half-wave plate disposed between the first polarization beam splitter and the first spatial light modulator, and a second half-wave plate disposed between the first polarization beam splitter and the second spatial light modulator.

Preferably, the imaging unit is an imaging function of the first spatial light modulator and an imaging function of the second spatial light modulator.

In accordance with another aspect of the present invention, there is provided a laser beam irradiating apparatus for irradiating a target object with a laser beam. The laser beam irradiating apparatus includes a laser oscillator configured to emit the laser beam, a polarization beam splitter configured to separate polarized components of the laser beam emitted from the laser oscillator into p-polarized light and s-polarized light, a first spatial light modulator on which one polarized component separated by the polarization beam splitter is made incident, and that is configured to modulate the incident laser beam according to a phase pattern, and emit the resulting laser beam, a second spatial light modulator on which another polarized component separated by the polarization beam splitter is made incident, and that is configured to modulate the incident laser beam according to a phase pattern, and emit the resulting laser beam, a first imaging unit configured to image the laser beam emitted from the first spatial light modulator, and irradiate the target object with the resulting laser beam, and a second imaging unit configured to image the laser beam emitted from the second spatial light modulator, and irradiate the target object with the resulting laser beam.

Preferably, the first imaging unit is an imaging function of the first spatial light modulator, and the second imaging unit is an imaging function of the second spatial light modulator.

The present invention produces an effect of being able to efficiently irradiate a target object with a laser beam emitted from a laser oscillator.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will hereinafter be described in detail with reference to the drawings. The present invention is not limited by contents described in the following embodiments. In addition, constituent elements described in the following include constituent elements readily conceivable by those skilled in the art and essentially identical constituent elements. Further, configurations described in the following can be combined with each other as appropriate. In addition, various omissions, replacements, or modifications of configurations can be performed without departing from the spirit of the present invention.

First Embodiment

Figure 1:
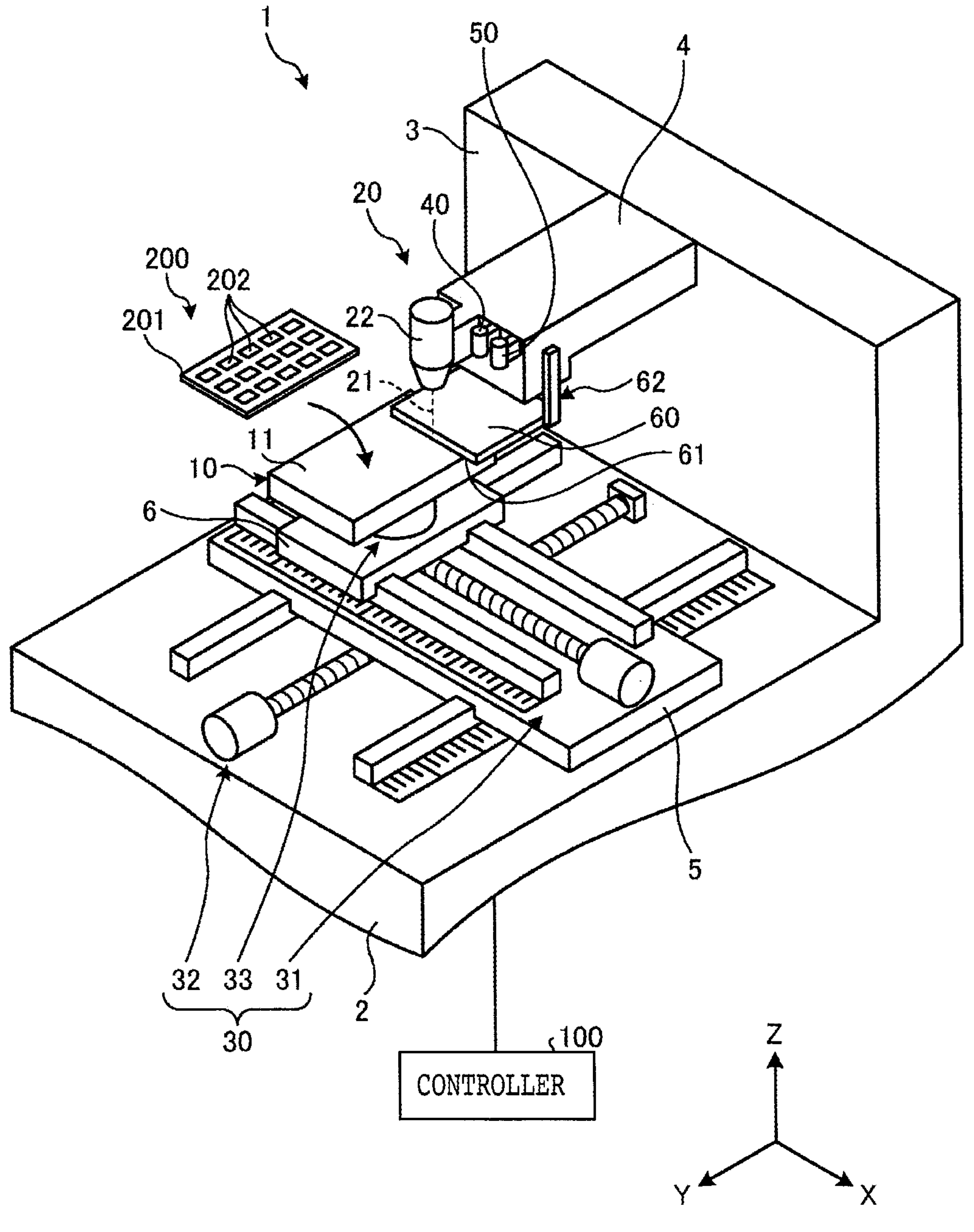
FIG. 1 is a perspective view depicting an example of a configuration of a laser beam irradiating apparatus according to a first embodiment.
Figure 2:
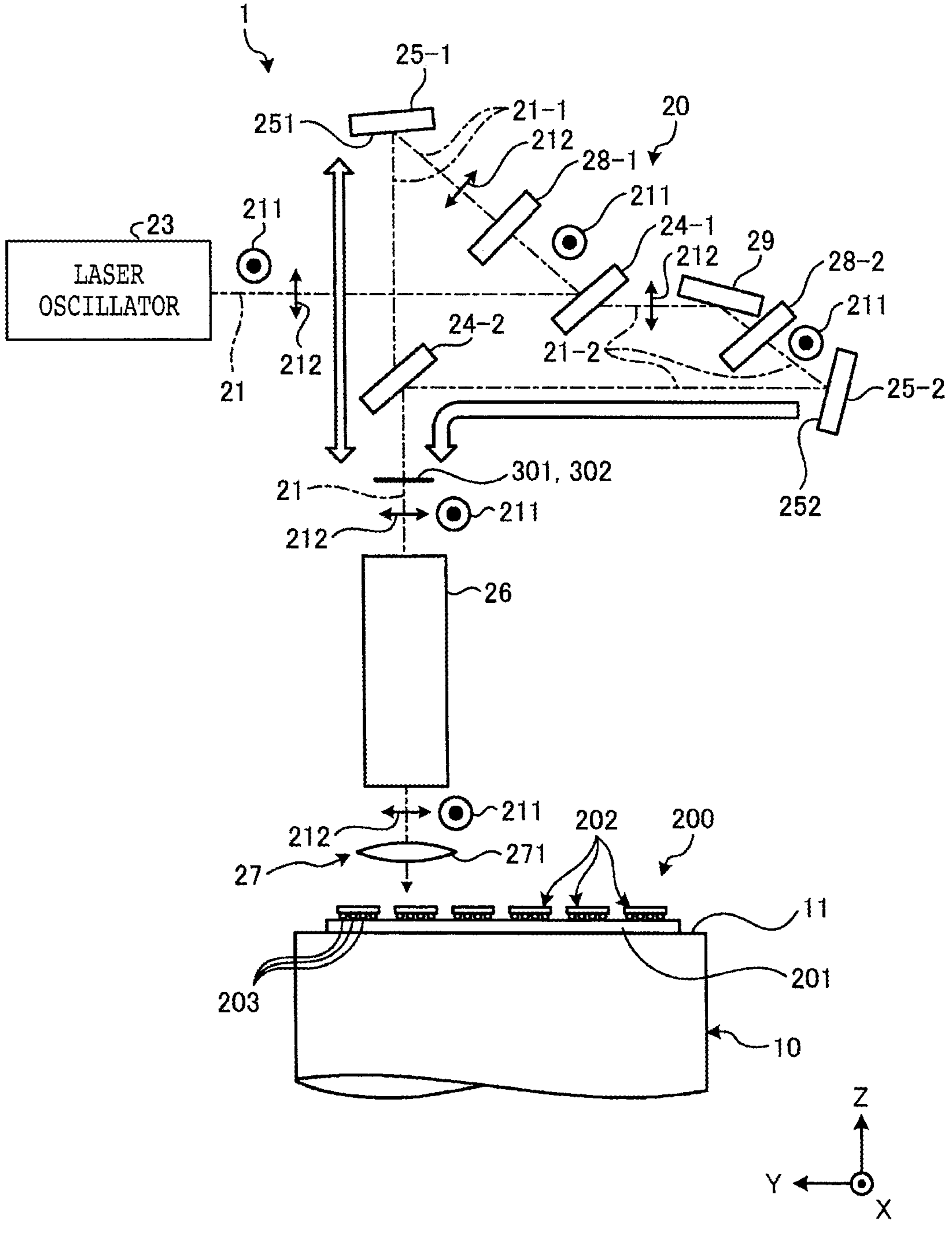
FIG. 2 is a diagram schematically depicting a configuration of a laser beam irradiating unit and the like of the laser beam irradiating apparatus depicted in FIG. 1.

A laser beam irradiating apparatus 1 according to a first embodiment of the present invention will be described with reference to drawings. FIG. 1 is a perspective view depicting an example of a configuration of the laser beam irradiating apparatus according to the first embodiment. FIG. 2 is a diagram schematically depicting a configuration of a laser beam irradiating unit and the like of the laser beam irradiating apparatus depicted in FIG. 1.

(Target Object)

The laser beam irradiating apparatus 1 depicted in FIG. 1 according to the first embodiment is a processing apparatus that irradiates a target object 200 with a laser beam 21. The target object 200 to be processed by the laser beam irradiating apparatus 1 according to the first embodiment, for example, includes a substrate 201 in a rectangular shape and semiconductor chips 202 plurally arranged on the substrate 201. Bumps 203 (depicted in FIG. 2) for connection of the semiconductor chips 202 of the target object 200 are reflowed by the laser beam 21. The semiconductor chips 202 are thereby flip-chip mounted onto the substrate 201. In the first embodiment, the substrate 201 is, for example, a printed circuit board (PCB), a device wafer before being divided into chips, or the like.

In the first embodiment, the target object 200 has the semiconductor chips 202 plurally arranged on the substrate 201 via the bumps 203. However, in the present invention, the target object 200 may have the semiconductor chips 202 plurally stacked, and have the bumps 203 provided between the semiconductor chips 202, or the target object 200 may have a wafer-on-wafer structure in which a plurality of device wafers are stacked, and the plurality of device wafers are bonded to each other by bumps.

(Laser Beam Irradiating Apparatus)

The laser beam irradiating apparatus 1 depicted in FIG. 1 is a processing apparatus that holds the substrate 201 of the target object 200 on a chuck table 10, reflows the bumps 203 by applying the laser beam 21 to the semiconductor chips 202 on the substrate 201 of the target object 200 which substrate is held on the chuck table 10, and thereby mounts the semiconductor chips 202 onto the substrate 201. As depicted in FIG. 1, the laser beam irradiating apparatus 1 includes the chuck table 10 that holds the target object 200, a laser beam irradiating unit 20 that irradiates the target object 200 held on the chuck table 10 with the laser beam 21, a moving unit 30, an imaging unit 40, and a controller 100.

The chuck table 10 holds the target object 200 by a holding surface 11 parallel with a horizontal direction. In addition, the chuck table 10 is rotated about an axis parallel with a Z-axis direction orthogonal to the holding surface 11 and parallel with a vertical direction by a rotational moving unit 33 of the moving unit 30. Together with the rotational moving unit 33, the chuck table 10 is moved in an X-axis direction parallel with the horizontal direction by an X-axis moving unit 31 of the moving unit 30, and is moved in a Y-axis direction parallel with the horizontal direction and orthogonal to the X-axis direction by a Y-axis moving unit 32. The chuck table 10 is moved by the moving unit 30 between a processing region below the laser beam irradiating unit 20 and a loading and unloading region that is separated from below the laser beam irradiating unit 20 and in which the target object 200 is loaded and unloaded.

The laser beam irradiating unit 20 is laser beam irradiating means for irradiating the target object 200 held on the holding surface 11 of the chuck table 10 with the laser beam 21 absorbable by at least the semiconductor chips 202 (that is, the target object 200). In the first embodiment, as depicted in FIG. 1, a processing head 22 of the laser beam irradiating unit 20 is disposed at a distal end of an arm portion 4 that has a proximal end supported by an erected wall 3 erected from an apparatus main body 2.

As depicted in FIG. 2, the laser beam irradiating unit 20 includes a laser oscillator 23 that emits the laser beam 21, a first polarization beam splitter 24-1, a first spatial light modulator 25-1, a second spatial light modulator 25-2, a second polarization beam splitter 24-2, a relay lens optical system 26, and an imaging unit 27.

In addition, the laser oscillator 23 emits the laser beam 21 whose polarized components include s-polarized light 211 and p-polarized light 212. Incidentally, FIG. 2 depicts polarized components at respective positions of optical paths of the laser beam 21 as appropriate.

The first polarization beam splitter 24-1 separates the polarized components of the laser beam 21 emitted from the laser oscillator 23 into the p-polarized light 212 and the s-polarized light 211. The first polarization beam splitter 24-1 is a polarization beam splitter that separates the polarized components of the laser beam 21 from each other. In the first embodiment, the first polarization beam splitter 24-1 reflects a laser beam 21 whose polarized component is the s-polarized light 211 in the laser beam 21 emitted from the laser oscillator 23, and transmits a laser beam 21 whose polarized component is the p-polarized light 212 in the laser beam 21 emitted from the laser oscillator 23. The first polarization beam splitter 24-1 thereby separates the laser beam 21 emitted from the laser oscillator 23 into the laser beam 21 of the s-polarized light 211 and the laser beam 21 of the p-polarized light 212. Incidentally, in the following, the laser beam 21 reflected by the first polarization beam splitter 24-1 will be described as a first laser beam 21-1, and the laser beam 21 transmitted by the first polarization beam splitter 24-1 will be described as a second laser beam 21-2.

Incidentally, in the first embodiment, the first laser beam 21-1 of the s-polarized light 211 reflected by the first polarization beam splitter 24-1 passes through a first half-wave plate 28-1, and thereby the polarization direction of the first laser beam 21-1 is rotated. The polarized component of the first laser beam 21-1 is consequently changed to p-polarized light 212. In addition, in the first embodiment, the second laser beam 21-2 of the p-polarized light 212 transmitted through the first polarization beam splitter 24-1 is reflected by a mirror 29, and thereafter passes through a second half-wave plate 28-2. The polarized component of the second laser beam 21-2 is consequently changed to s-polarized light 211.

The half-wave plates 28-1 and 28-2 change the polarized components of the laser beams 21-1 and 21-2 from the s-polarized light 211 to the p-polarized light 212 and from the p-polarized light 212 to the s-polarized light 211. That is, in the first embodiment, the laser beam irradiating unit 20 further includes the first half-wave plate 28-1 disposed between the first polarization beam splitter 24-1 and the first spatial light modulator 25-1 and the second half-wave plate 28-2 disposed between the first polarization beam splitter 24-1 and the second spatial light modulator 25-2. However, in the present invention, the laser beam irradiating unit 20 does not have to include both of the half-wave plates 28-1 and 28-2.

The first laser beam 21-1 of the p-polarized light 212 as one polarized component separated by the first polarization beam splitter 24-1 which polarized component is changed by the first half-wave plate 28-1 is made incident on the first spatial light modulator 25-1. The first spatial light modulator 25-1 modulates the incident first laser beam 21-1 according to a phase pattern, and emits the resulting first laser beam 21-1. In the first embodiment, the first spatial light modulator 25-1 is a generally-called liquid crystal on silicon-spatial light modulator (LCOS-SLM) that modulates the optical characteristics of the first laser beam 21-1, and emits the resulting first laser beam 21-1.

In the first embodiment, the first spatial light modulator 25-1 has a display surface 251 that displays the phase pattern for modulating the optical characteristics of the first laser beam 21-1. The first spatial light modulator 25-1 modulates the optical characteristics of the first laser beam 21-1 by reflecting the first laser beam 21-1 by the display surface 251 displaying the phase pattern. The display surface 251 is formed by a liquid crystal display (LCD) apparatus.

In the first embodiment, the first spatial light modulator 25-1 is disposed such that the light distribution direction of the LCD apparatus constituting the display surface 251 is a direction corresponding to the p-polarized light 212 as the polarized component of the incident first laser beam 21-1. The first spatial light modulator 25-1 reflects the first laser beam 21-1 by the display surface 251, and emits the first laser beam 21-1 to the second polarization beam splitter 24-2.

The second laser beam 21-2 of the s-polarized light 211 as the other polarized component separated by the first polarization beam splitter 24-1 which polarized component is changed by the second half-wave plate 28-2 is made incident on the second spatial light modulator 25-2. The second spatial light modulator 25-2 modulates the incident second laser beam 21-2 according to a phase pattern, and emits the resulting second laser beam 21-2. In the first embodiment, the second spatial light modulator 25-2 is a generally-called liquid crystal on LCOS-SLM that modulates the optical characteristics of the first laser beam 21-1, and emits the resulting first laser beam 21-1.

In the first embodiment, the second spatial light modulator 25-2 has a display surface 252 that displays the phase pattern for modulating the optical characteristics of the second laser beam 21-2. The second spatial light modulator 25-2 modulates the optical characteristics of the second laser beam 21-2 by reflecting the second laser beam 21-2 by the display surface 252 displaying the phase pattern. The display surface 252 is formed by the LCD apparatus.

In the first embodiment, the second spatial light modulator 25-2 is disposed such that the light distribution direction of the LCD apparatus constituting the display surface 252 is a direction corresponding to the s-polarized light 211 as the polarized component of the incident second laser beam 21-2. The second spatial light modulator 25-2 reflects the second laser beam 21-2 by the display surface 252, and emits the second laser beam 21-2 to the second polarization beam splitter 24-2.

The second polarization beam splitter 24-2 transmits the first laser beam 21-1 emitted from the first spatial light modulator 25-1 and reflects the second laser beam 21-2 emitted from the second spatial light modulator 25-2, thereby synthesizes the first laser beam 21-1 emitted from the first spatial light modulator 25-1 and the second laser beam 21-2 emitted from the second spatial light modulator 25-2, and emits the laser beam 21 whose polarized components after the synthesis include the p-polarized light 212 and the s-polarized light 211. Incidentally, the laser beam 21 is a laser beam modulated by the spatial light modulators 25-1 and 25-2 so as to have optical characteristics suitable for application to the target object 200.

In the first embodiment, the second polarization beam splitter 24-2 emits the synthesized laser beam 21 to the relay lens optical system 26.

The relay lens optical system 26 includes at least one or more optical parts such as a well-known lens. The relay lens optical system 26 emits the laser beam 21 emitted by the second polarization beam splitter 24-2 to the imaging unit 27.

The imaging unit 27 images the laser beam 21 synthesized by the second polarization beam splitter 24-2, and applies the resulting laser beam 21 to the target object 200 held on the holding surface 11 of the chuck table 10. The imaging unit 27 includes an imaging lens 271 that images the laser beam 21 onto the semiconductor chips 202 of the target object 200 held on the holding surface 11 of the chuck table 10, and a lens moving unit not depicted.

The imaging lens 271 is, for example, disposed within the processing head 22, and disposed in a position opposed to the holding surface 11 of the chuck table 10 along the Z-axis direction parallel with the vertical direction. The imaging lens 271 is an imaging element that images and applies the laser beam 21 onto the target object 200 held on the chuck table 10.

The lens moving unit changes a distance in the Z-axis direction between the imaging lens 271 and the target object 200 held on the chuck table 10. In the first embodiment, the lens moving unit relatively changes the distance between the imaging lens 271 and the target object 200 held on the chuck table 10 along the optical axis of the laser beam 21 by moving the imaging lens 271 along the optical axis of the laser beam 21 which optical axis is parallel with the Z-axis direction. In the first embodiment, the lens moving unit includes a well-known ball screw that is provided so as to be rotatable about an axis and is parallel with the Z-axis direction, a well-known pulse motor that rotates the ball screw about the axis, and well-known guide rails that support the imaging lens 271 movably in the Z-axis direction.

In addition, in the first embodiment, the laser beam irradiating unit 20 is adjusted such that a conjugate plane 301 of the first laser beam 21-1 and a conjugate plane 302 of the second laser beam 21-2 coincide with each other. In addition, in order to make the conjugate planes 301 and 302 of the first laser beam 21-1 and the second laser beam 21-2 coincide with each other, the optical system may be configured such that the optical path length of the first laser beam 21-1 and the optical path length of the second laser beam 21-2 are lengths coinciding with each other, or the conjugate planes 301 and 302 may be made to coincide with each other by controlling the phase patterns displayed on the first spatial light modulator 25-1 and the second spatial light modulator 25-2. Incidentally, in the first embodiment, the conjugate planes 301 and 302 are formed between the second polarization beam splitter 24-2 and the relay lens optical system 26.

The laser beam irradiating unit 20 heats the semiconductor chips 202 by irradiating the target object 200 held on the chuck table 10 with the laser beam 21 having a wavelength absorbable by at least the semiconductor chips 202 of the target object 200. The bumps 203 are thereby reflowed to mount (bond and fix) the semiconductor chips 202 onto the substrate 201.

The moving unit 30 moves the chuck table 10 and the processing head 22 of the laser beam irradiating unit 20 relative to each other in the X-axis direction and the Y-axis direction and about an axis parallel with the Z-axis direction. The X-axis direction and the Y-axis direction are directions orthogonal to each other and parallel with the holding surface 11 (that is, the horizontal direction). The moving unit 30 includes the X-axis moving unit 31 as a processing feed unit that moves the chuck table 10 in the X-axis direction, the Y-axis moving unit 32 as an indexing feed unit that moves the chuck table 10 in the Y-axis direction, and the rotational moving unit 33 that rotates the chuck table 10 about the axis parallel with the Z-axis direction.

The Y-axis moving unit 32 is the indexing feed unit that moves the chuck table 10 and the processing head 22 of the laser beam irradiating unit 20 relative to each other in the Y-axis direction. In the first embodiment, the Y-axis moving unit 32 is installed on the apparatus main body 2 of the laser beam irradiating apparatus 1. The Y-axis moving unit 32 supports a moving plate 5 movably in the Y-axis direction, the moving plate 5 supporting the X-axis moving unit 31.

The X-axis moving unit 31 is the processing feed unit that moves the chuck table 10 and the processing head 22 of the laser beam irradiating unit 20 relative to each other in the X-axis direction. The X-axis moving unit 31 is installed on the moving plate 5. The X-axis moving unit 31 supports a second moving plate 6 movably in the X-axis direction, the second moving plate 6 supporting the rotational moving unit 33 that rotates the chuck table 10 about the axis parallel with the Z-axis direction. The second moving plate 6 supports the rotational moving unit 33 and the chuck table 10. The rotational moving unit 33 supports the chuck table 10.

The X-axis moving unit 31 and the Y-axis moving unit 32 include a well-known ball screw that is provided so as to be rotatable about an axis, a well-known pulse motor that rotates the ball screw about the axis, and well-known guide rails that support the moving plate 5 or 6 movably in the X-axis direction or the Y-axis direction. The rotational moving unit 33 includes a motor or the like that rotates the chuck table 10 about the axis.

In addition, the laser beam irradiating apparatus 1 includes an X-axis direction position detecting unit, not depicted, for detecting a position in the X-axis direction of the chuck table 10, a Y-axis direction position detecting unit, not depicted, for detecting a position in the Y-axis direction of the chuck table 10, and a Z-axis direction position detecting unit, not depicted, for detecting a position in the Z-axis direction of the laser beam irradiating unit 20. Each of the position detecting units outputs a result of the detection to the controller 100.

In addition, the laser beam irradiating apparatus 1 includes a lens position detecting unit, not depicted, for detecting a position in the Z-axis direction of the imaging lens 271 of the laser beam irradiating unit 20. The lens position detecting unit outputs a result of the detection to the controller 100.

The imaging unit 40 images the target object 200 held on the chuck table 10. The imaging unit 40 includes an imaging element such as a charge coupled device (CCD) imaging element or a complementary metal oxide semiconductor (CMOS) imaging element, which images an object to which an objective lens is opposed in the Z-axis direction. In the first embodiment, as depicted in FIG. 1, the imaging unit 40 is disposed at the distal end of the arm portion 4.

The imaging unit 40 obtains an image imaged by the imaging element, and outputs the obtained image to the controller 100. In addition, the imaging unit 40 images the target object 200 held on the holding surface 11 of the chuck table 10, and thereby obtains an image for carrying out alignment that aligns the target object 200 and the imaging lens 271 of the laser beam irradiating unit 20 with each other.

In addition, the laser beam irradiating apparatus 1 includes a temperature detector 50, a pressing member 60, and the like. The temperature detector 50 detects the temperature of the target object 200 held on the holding surface 11 of the chuck table 10. The temperature detector 50, for example, includes an infrared camera. The temperature detector 50 outputs information indicating the detected temperature of the target object 200 to the controller 100. In the first embodiment, the temperature detector 50 is disposed at a position aligned with the imaging unit 40 at the distal end of the arm portion 4 in the X-axis direction.

The pressing member 60 presses the semiconductor chips 202 of the target object 200 held on the chuck table 10 toward the holding surface 11 of the chuck table 10 by a lower surface 61. The pressing member 60 is disposed between the arm portion 4 and the chuck table 10. The lower surface 61 is formed so as to be flat along the horizontal direction. The pressing member 60 is formed of a material that transmits the laser beam 21 (for example, quartz glass or the like). The pressing member 60 is raised and lowered along the Z-axis direction by a raising and lowering unit 62 attached to the arm portion 4.

The controller 100 makes the laser beam irradiating apparatus 1 perform processing operation on the target object 200 by controlling each of the above-described constituent elements of the laser beam irradiating apparatus 1. Incidentally, the controller 100 is a computer including an arithmetic processing device having a microprocessor such as a central processing unit (CPU), a storage device having a memory such as a read only memory (ROM) or a random access memory (RAM), and an input-output interface apparatus. The arithmetic processing device of the controller 100 implements functions of the controller 100 by performing arithmetic processing according to a computer program stored in the storage device, and outputting control signals for controlling the laser beam irradiating apparatus 1 to the above-described constituent elements of the laser beam irradiating apparatus 1 via the input-output interface apparatus.

In addition, the laser beam irradiating apparatus 1 includes a display unit as display means formed by the LCD apparatus or the like that displays a state of processing operation, an image, and the like, an input unit as input means used when an operator inputs processing conditions or the like, and the like. The display unit and the input unit are connected to the controller 100. The input unit is formed by at least one of a touch panel provided to the display unit and an external input apparatus such as a keyboard.

Processing operation of the laser beam irradiating apparatus 1 having the above-described configuration will next be described. The controller 100 of the laser beam irradiating apparatus 1 receives and registers processing conditions input by the operator. The target object 200 is mounted onto the holding surface 11 of the chuck table 10 positioned in the loading and unloading region. The laser beam irradiating apparatus 1 starts the processing operation when the controller 100 receives an instruction to start the processing operation from the operator.

In the processing operation, the laser beam irradiating apparatus 1 moves the chuck table 10 to the processing region by control of the moving unit 30 by the controller 100, obtains an image by imaging the target object 200 sucked and held on the chuck table 10 by the imaging unit 40, and carries out alignment. In the processing operation, the controller 100 controls the moving unit 30 and the laser beam irradiating unit 20 so that the laser beam irradiating apparatus 1 irradiates the semiconductor chips 202 of the target object 200 with the laser beam 21 while moving the processing head 22 of the laser beam irradiating unit 20 and the chuck table 10 relative to each other according to the processing conditions. The bumps 203 are thereby reflowed to bond the semiconductor chips 202 to the substrate 201.

Incidentally, in the processing operation in the first embodiment, when the laser beam irradiating apparatus 1 irradiates the semiconductor chips 202 with the laser beam 21, the laser beam irradiating apparatus 1 lowers the pressing member 60 by the raising and lowering unit 62, thus presses the semiconductor chips 202 of the target object 200 on the chuck table 10 toward the holding surface 11 of the chuck table 10 by the lower surface 61 of the pressing member 60, and irradiates the target object 200 with the laser beam 21 through the pressing member 60. In addition, in the processing operation in the first embodiment, the controller 100 of the laser beam irradiating apparatus 1 may change the laser power density of the laser beam 21 or the like so as to suppress damage to the semiconductor chips 202 and the like on the basis of a detection result of the temperature detector 50.

In addition, in the processing operation in the first embodiment, the laser beam irradiating apparatus 1 irradiates one semiconductor chip 202 with the laser beam 21 at a time. In the present invention, however, the laser beam irradiating apparatus 1 may irradiate a plurality of semiconductor chips 202 with the laser beam 21 at a time. The laser beam irradiating apparatus 1 ends the processing operation when the laser beam irradiating apparatus 1 irradiates all of the semiconductor chips 202 of the target object 200 held on the chuck table 10 with the laser beam 21 and thereby bonds all of the semiconductor chips 202 to the substrate 201.

The laser beam irradiating apparatus 1 according to the first embodiment described above separates the laser beam 21 into the first laser beam 21-1 of the s-polarized light 211 and the second laser beam 21-2 of the p-polarized light 212 by the first polarization beam splitter 24-1, thereafter makes the laser beams 21-1 and 21-2 of the respective polarized components incident on the different spatial light modulators 25-1 and 25-2, synthesizes, by the second polarization beam splitter 24-2, the laser beams 21-1 and 21-2 modulated by the spatial light modulators 25-1 and 25-2, and irradiates the target object 200 with the synthesized laser beam. As a result, the laser beam irradiating apparatus 1 according to the first embodiment produces an effect of being able to suppress the halving of energy of the laser beam 21 applied to the target object 200 and thus efficiently irradiate the target object 200 with the laser beam 21 emitted from the laser oscillator 23.

Second Embodiment

Figure 3:
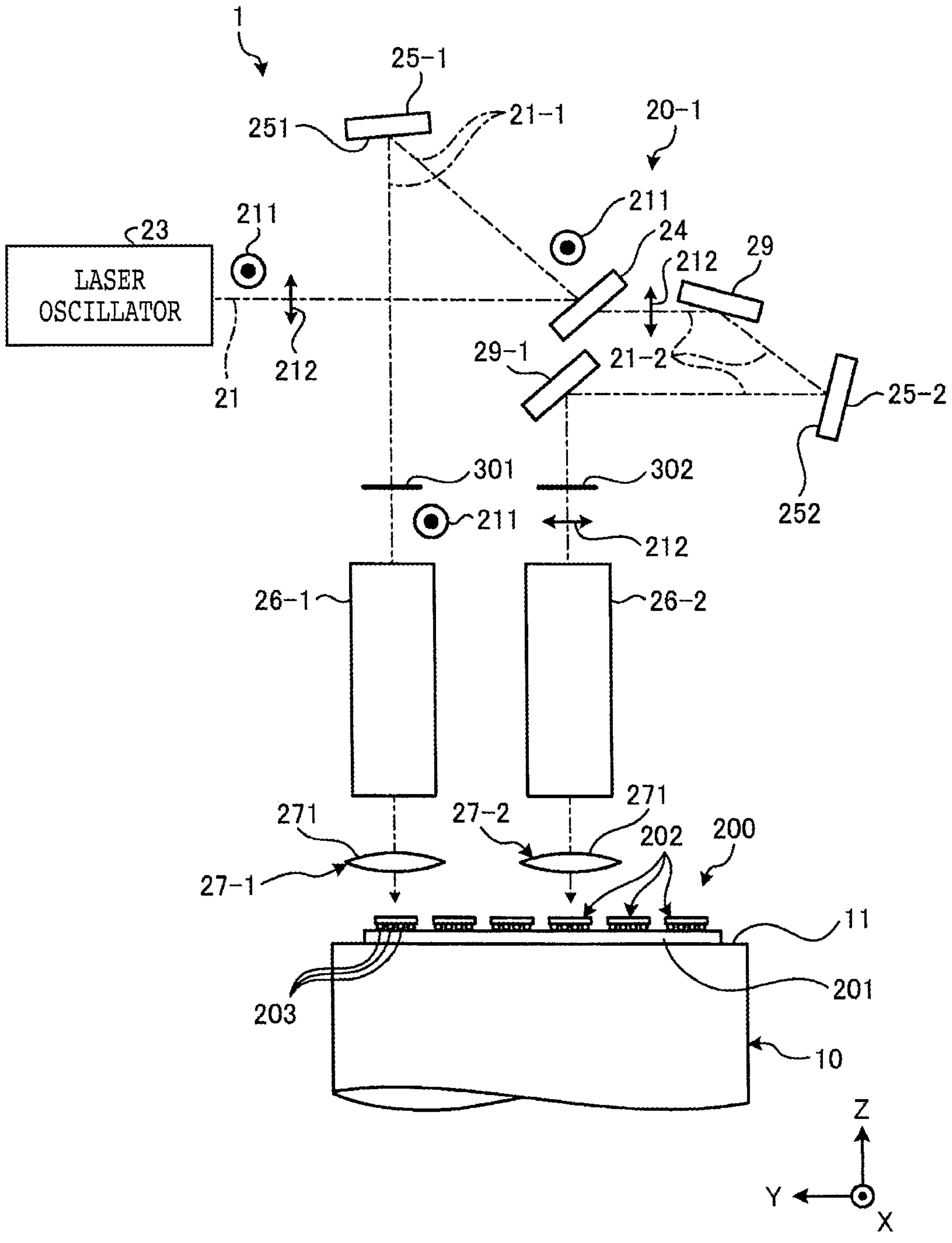
FIG. 3 is a diagram schematically depicting a configuration of a laser beam irradiating unit and the like of a laser beam irradiating apparatus according to a second embodiment.

A laser beam irradiating apparatus 1 according to a second embodiment will be described with reference to a drawing. FIG. 3 is a diagram schematically depicting a configuration of a laser beam irradiating unit and the like of the laser beam irradiating apparatus according to the second embodiment. Incidentally, in FIG. 3, description of identical parts to those of the first embodiment will be omitted by identifying the identical parts by the same reference numerals, and as in FIG. 2, polarized components at respective positions of optical paths of the laser beam 21 are depicted as appropriate. The laser beam irradiating apparatus 1 according to the second embodiment is the same as that of the first embodiment except for the configuration of the laser beam irradiating unit 20.

As depicted in FIG. 3, a laser beam irradiating unit 20-1 of the laser beam irradiating apparatus 1 according to the second embodiment includes a laser oscillator 23 that emits the laser beam 21, a polarization beam splitter 24, a first spatial light modulator 25-1, a second spatial light modulator 25-2, a first relay lens optical system 26-1, a second relay lens optical system 26-2, a first imaging unit 27-1, and a second imaging unit 27-2.

In the second embodiment, the polarization beam splitter 24 has the same configuration as that of the first polarization beam splitter 24-1 in the first embodiment. In the second embodiment, the polarization beam splitter 24 reflects a first laser beam 21-1 whose polarized component is s-polarized light 211 in the laser beam 21 emitted from the laser oscillator 23 toward the first spatial light modulator 25-1, and transmits a second laser beam 21-2 whose polarized component is p-polarized light 212. The polarization beam splitter 24 thereby separates the laser beam 21 into the first laser beam 21-1 of the s-polarized light 211 and the second laser beam 21-2 of the p-polarized light 212.

Incidentally, in the second embodiment, the first laser beam 21-1 of the s-polarized light 211 which laser beam is reflected by the polarization beam splitter 24 is applied to the display surface 251 of the first spatial light modulator 25-1. In addition, in the second embodiment, the second laser beam 21-2 of the p-polarized light 212 which laser beam is transmitted by the polarization beam splitter 24 is reflected by the mirror 29, and is thereafter applied to the display surface 252 of the second spatial light modulator 25-2.

The first spatial light modulator 25-1 is a generally-called LCOS-SLM on which the first laser beam 21-1 of the s-polarized light 211 as one polarized component separated by the polarization beam splitter 24 is made incident, and which modulates the incident first laser beam 21-1 according to a phase pattern, and emits the resulting first laser beam 21-1. In the second embodiment, the first spatial light modulator 25-1 reflects the first laser beam 21-1 by the display surface 251, thereby modulates the optical characteristics of the first laser beam 21-1, and emits the resulting first laser beam 21-1 to the first relay lens optical system 26-1.

The second spatial light modulator 25-2 is a generally-called LCOS-SLM on which the second laser beam 21-2 of the p-polarized light 212 as another polarized component separated by the polarization beam splitter 24 is made incident, and which modulates the incident second laser beam 21-2 according to a phase pattern, and emits the resulting second laser beam 21-2. In the second embodiment, the second spatial light modulator 25-2 reflects the second laser beam 21-2 by the display surface 252, thereby modulates the optical characteristics of the second laser beam 21-2, and emits the resulting second laser beam 21-2. Incidentally, in the second embodiment, the second laser beam 21-2 whose optical characteristics are changed by the second spatial light modulator 25-2 is reflected by a mirror 29-1 toward the second relay lens optical system 26-2.

The first relay lens optical system 26-1 emits the first laser beam 21-1 whose optical characteristics are modulated by the first spatial light modulator 25-1 toward the first imaging unit 27-1. The second relay lens optical system 26-2 emits the second laser beam 21-2 whose optical characteristics are modulated by the second spatial light modulator 25-2 toward the second imaging unit 27-2. As with the relay lens optical system 26 in the first embodiment, the relay lens optical systems 26-1 and 26-2 include at least one or more optical parts such as a well-known lens.

The first imaging unit 27-1 images the first laser beam 21-1 emitted from the first spatial light modulator 25-1, and applies the resulting first laser beam 21-1 to the target object 200 held on the holding surface 11 of the chuck table 10. The second imaging unit 27-2 images the second laser beam 21-2 emitted from the second spatial light modulator 25-2, and applies the resulting second laser beam 21-2 to the target object 200 held on the holding surface 11 of the chuck table 10. It is to be noted that the imaging units 27-1 and 27-2 image the laser beams 21-1 and 21-2 that are separated from the laser beam 21 by the polarization beam splitter 24 and are independent of each other onto the target object 200 held on the holding surface 11 of the chuck table 10. That is, in the second embodiment, the laser beam irradiating unit 20 irradiates the target object 200 with the two laser beams 21-1 and 21-2 at the same time.

As with the imaging unit 27 in the first embodiment, each of the imaging units 27-1 and 27-2 includes an imaging lens 271 that images the laser beam 21-1 or 21-2 onto the semiconductor chips 202 of the target object 200 held on the holding surface 11 of the chuck table 10, and a lens moving unit not depicted.

The imaging lens 271 is, for example, disposed within the processing head 22, and disposed in a position opposed to the holding surface 11 of the chuck table 10 along the Z-axis direction parallel with the vertical direction. The imaging lens 271 is an imaging element that images and applies the laser beam 21-1 or 21-2 onto the target object 200 held on the chuck table 10.

The lens moving unit changes a distance in the Z-axis direction between the imaging lens 271 and the target object 200 held on the chuck table 10. In the second embodiment, the lens moving unit relatively changes the distance between the imaging lens 271 and the target object 200 held on the chuck table 10 along the optical axis of the laser beam 21-1 or 21-2 by moving the imaging lens 271 along the optical axis of the laser beam 21-1 or 21-2 which optical axis is parallel with the Z-axis direction.

In addition, in the second embodiment, the laser beam irradiating unit 20 is adjusted such that the conjugate plane 301 of the first laser beam 21-1 and the conjugate plane 302 of the second laser beam 21-2 coincide with each other. In addition, in order to make the conjugate plane 301 of the first laser beam 21-1 and the conjugate plane 302 of the second laser beam 21-2 coincide with each other, the optical system may be configured such that the optical path length of the first laser beam 21-1 and the optical path length of the second laser beam 21-2 are lengths coinciding with each other, or the conjugate planes 301 and 302 may be made to coincide with each other by controlling the phase patterns displayed on the first spatial light modulator 25-1 and the second spatial light modulator 25-2. Incidentally, in the second embodiment, the conjugate plane 301 is formed between the first spatial light modulator 25-1 and the first relay lens optical system 26-1, and the conjugate plane 302 is formed between the mirror 29-1 and the second relay lens optical system 26-2. In addition, in the present invention, the conjugate planes 301 and 302 in the second embodiment do not have to coincide with each other, and the positions of the respective conjugate planes 301 and 302 may be adjusted according to an irradiated region of the target object which region is irradiated with the first laser beam 21-1 and an irradiated region of the target object which region is irradiated with the second laser beam 21-2.

In the second embodiment, the laser beam irradiating unit 20 heats the semiconductor chips 202 by irradiating the target object 200 held on the chuck table 10 with the two laser beams 21-1 and 21-2 having a wavelength absorbable by at least the semiconductor chips 202 of the target object 200. The bumps 203 are thereby reflowed to mount (bond and fix) the semiconductor chips 202 onto the substrate 201.

The laser beam irradiating apparatus 1 according to the second embodiment separates the laser beam 21 into the first laser beam 21-1 of the s-polarized light 211 and the second laser beam 21-2 of the p-polarized light 212 by the polarization beam splitter 24, thereafter makes the laser beams 21-1 and 21-2 of the respective polarized components incident on the different spatial light modulators 25-1 and 25-2, and irradiates the target object 200 with each of the laser beams 21-1 and 21-2 modulated by the spatial light modulators 25-1 and 25-2. As a result, the laser beam irradiating apparatus 1 according to the second embodiment produces an effect of being able to suppress the halving of energy of the laser beam 21 applied to the target object 200, and thus efficiently irradiate the target object 200 with the laser beam 21 emitted from the laser oscillator 23.

Third Embodiment

Figure 4:
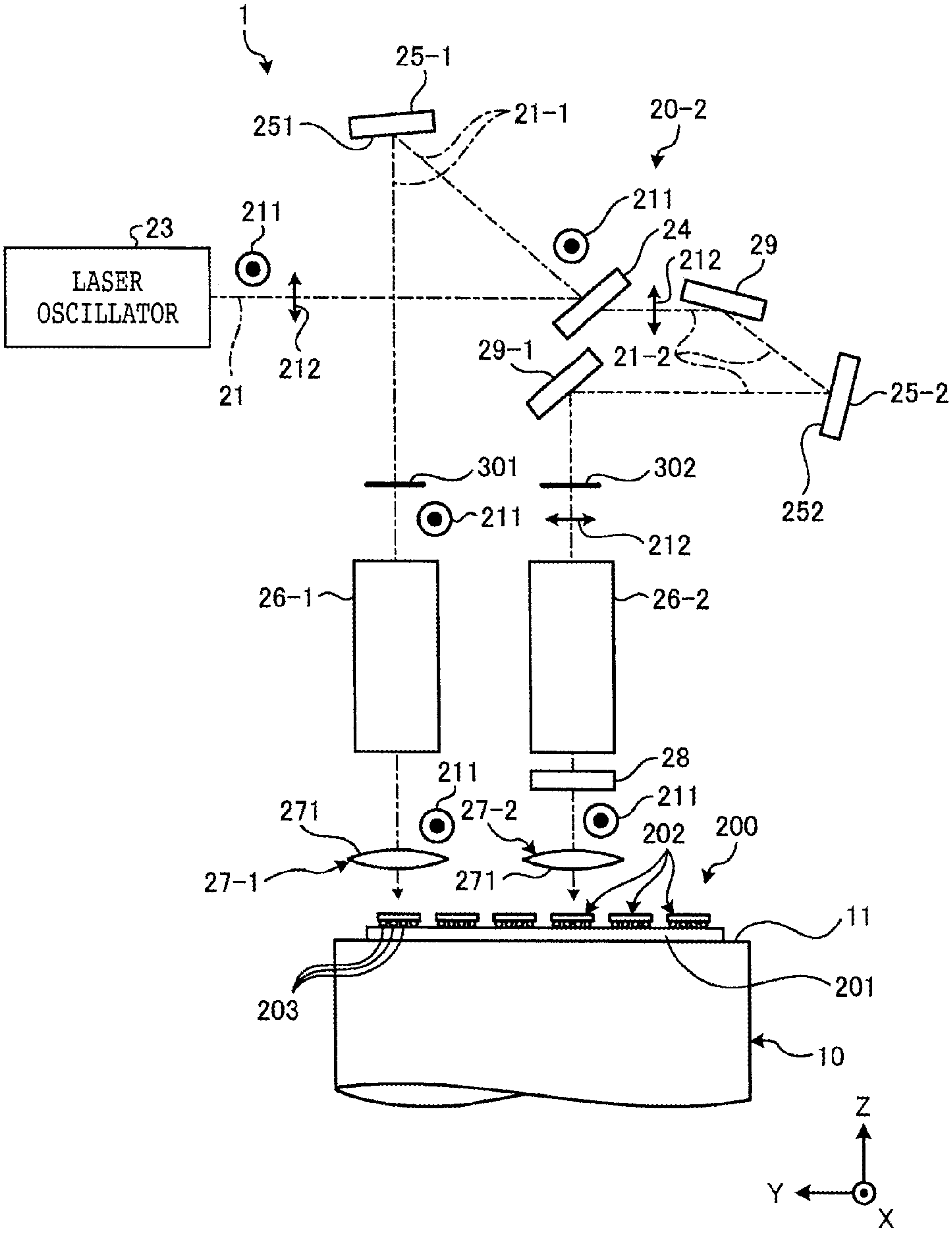
FIG. 4 is a diagram schematically depicting a configuration of a laser beam irradiating unit and the like of a laser beam irradiating apparatus according to a third embodiment.

A laser beam irradiating apparatus 1 according to a third embodiment will be described with reference to a drawing. FIG. 4 is a diagram schematically depicting a configuration of a laser beam irradiating unit and the like of the laser beam irradiating apparatus according to the third embodiment. Incidentally, in FIG. 4, description of identical parts to those of the second embodiment will be omitted by identifying the identical parts by the same reference numerals, and as in FIG. 2, polarized components at respective positions of optical paths of the laser beam 21 are depicted as appropriate.

A laser beam irradiating unit 20-2 of the laser beam irradiating apparatus 1 according to the third embodiment is the same as that of the second embodiment except that a half-wave plate 28 is disposed at least either between the first relay lens optical system 26-1 and the first imaging unit 27-1 or between the second relay lens optical system 26-2 and the second imaging unit 27-2. Incidentally, the configuration of the half-wave plate 28 is the same as the configuration of the half-wave plates 28-1 and 28-2 in the first embodiment.

The laser beam irradiating unit 20-2 of the laser beam irradiating apparatus 1 according to the third embodiment has the half-wave plate 28 disposed between the second relay lens optical system 26-2 and the second imaging unit 27-2. The half-wave plate 28 changes the polarized component of the second laser beam 21-2 from p-polarized light 212 to s-polarized light 211. The laser beam irradiating unit 20 of the laser beam irradiating apparatus 1 according to the third embodiment irradiates the target object 200 with the two laser beams 21-1 and 21-2 of the s-polarized light 211 at the same time.

The laser beam irradiating apparatus 1 according to the third embodiment separates the laser beam 21 into the first laser beam 21-1 of the s-polarized light 211 and the second laser beam 21-2 of the p-polarized light 212 by the polarization beam splitter 24, and thereafter irradiates the target object 200 with each of the laser beams 21-1 and 21-2 modulated by the spatial light modulators 25-1 and 25-2. Therefore, as in the second embodiment, the laser beam irradiating apparatus 1 according to the third embodiment produces an effect of being able to efficiently irradiate the target object 200 with the laser beam 21 emitted from the laser oscillator 23.

In addition, even in a case where polarization directions affect a processing result as in stealth dicing (SD) processing that forms a modified layer or the like, the laser beam irradiating apparatus 1 according to the third embodiment can perform the processing suitably because the polarization directions of the two laser beams 21-1 and 21-2 are the same.

Incidentally, the laser beam irradiating apparatuses 1 according to the first embodiment, the second embodiment, and the third embodiment may be used for the SD processing that forms a modified layer or the like within the target object by condensing, within the target object, a laser beam having a wavelength transmissible through the target object.

[Modifications]

Figure 5:
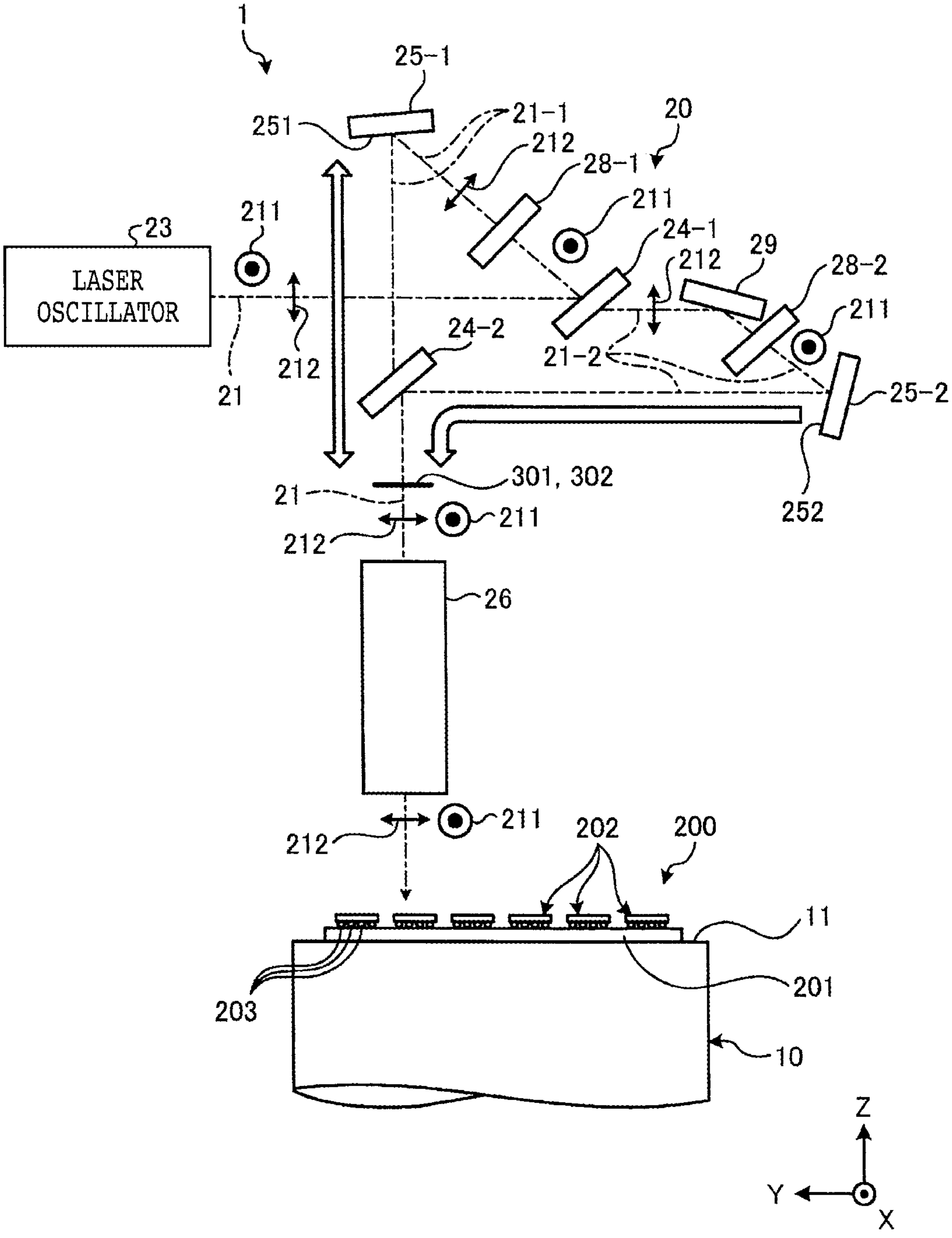
FIG. 5 is a diagram schematically depicting a configuration of a laser beam irradiating unit and the like of a laser beam irradiating apparatus according to a modification of the first embodiment.
Figure 6:
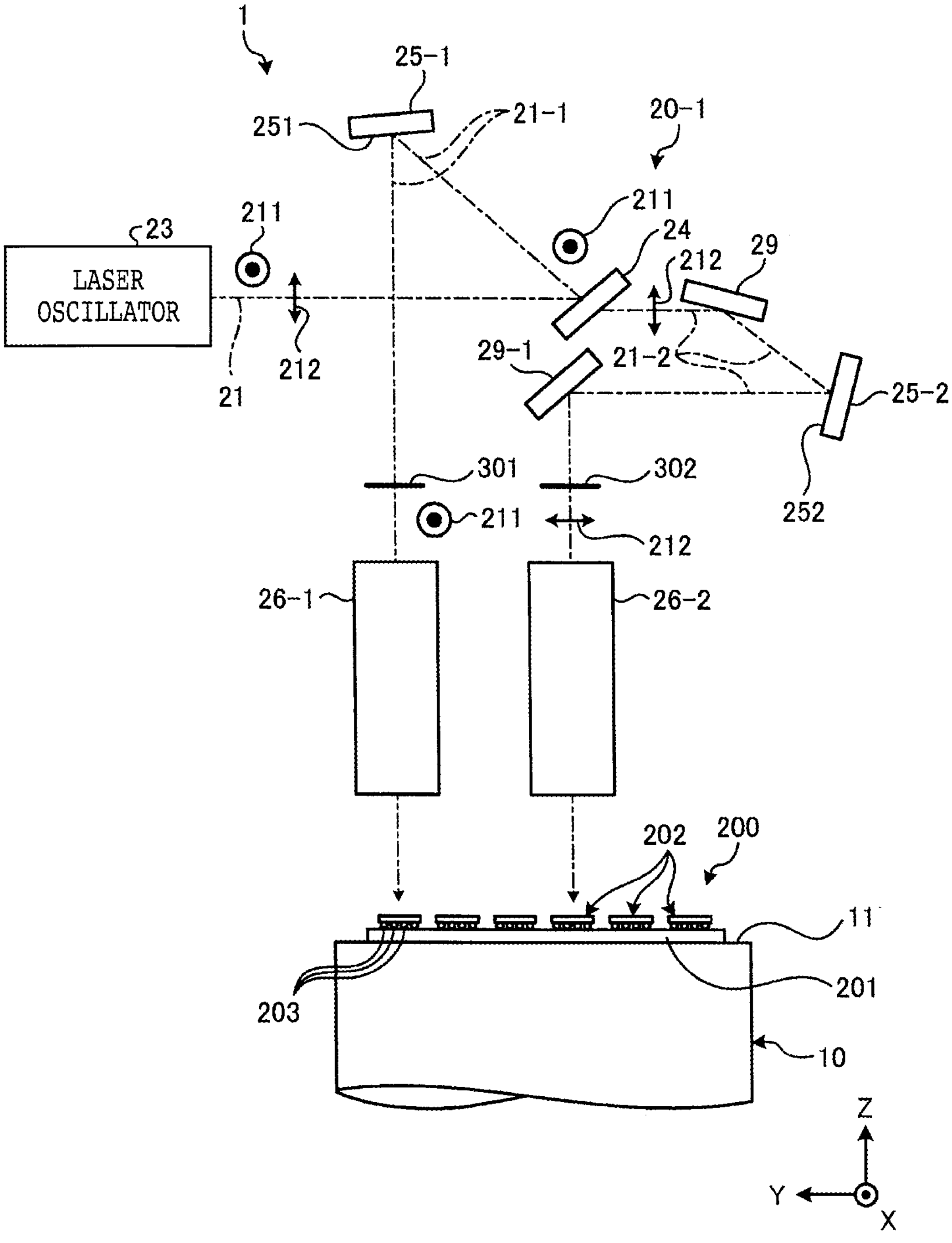
FIG. 6 is a diagram schematically depicting a configuration of a laser beam irradiating unit and the like of a laser beam irradiating apparatus according to a modification of the second embodiment.
Figure 7:
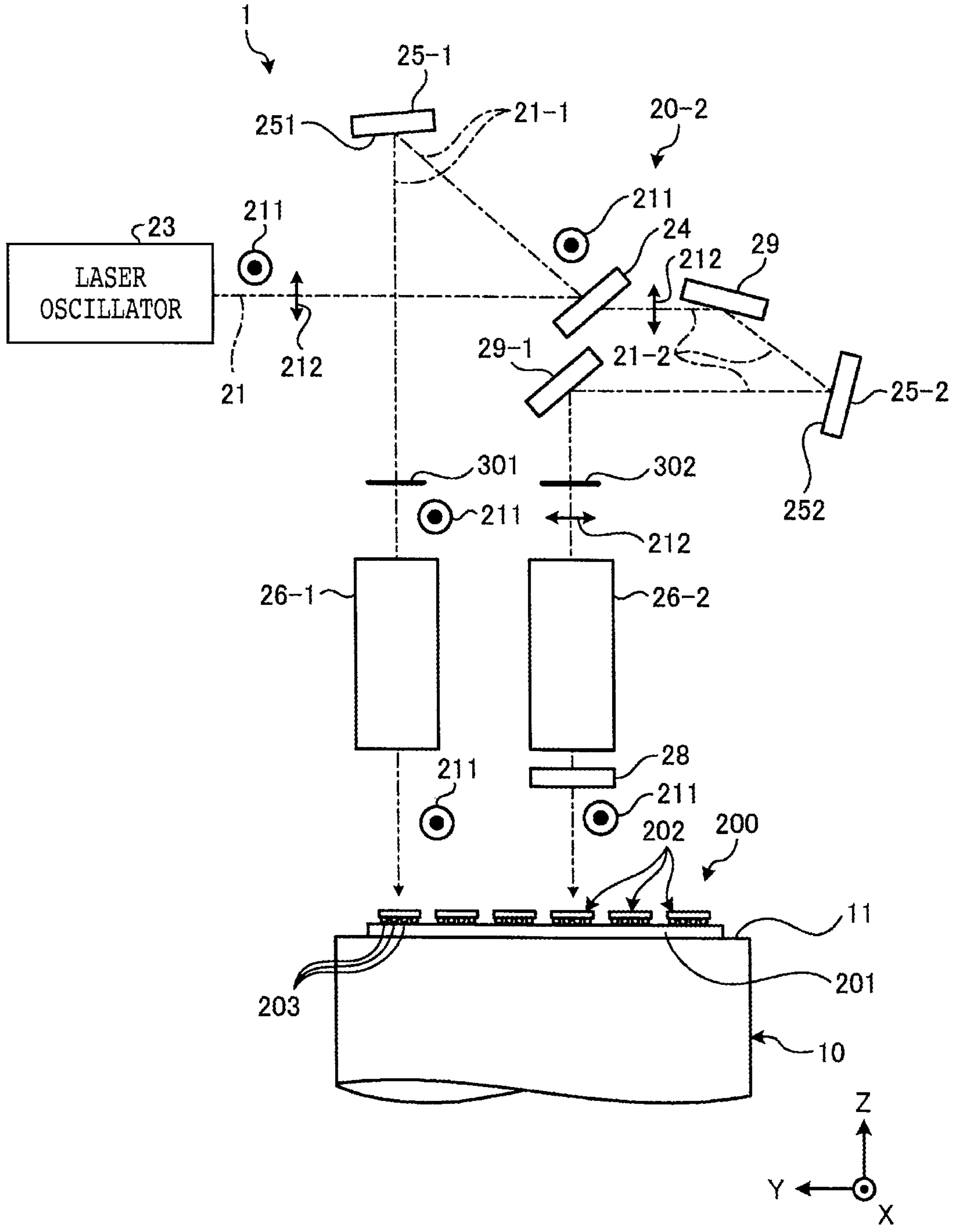
FIG. 7 is a diagram schematically depicting a configuration of a laser beam irradiating unit and the like of a laser beam irradiating apparatus according to a modification of the third embodiment.

Laser beam irradiating apparatuses 1 according to modifications will be described with reference to drawings. FIG. 5 is a diagram schematically depicting a configuration of a laser beam irradiating unit and the like of a laser beam irradiating apparatus according to a modification of the first embodiment. FIG. 6 is a diagram schematically depicting a configuration of a laser beam irradiating unit and the like of a laser beam irradiating apparatus according to a modification of the second embodiment. FIG. 7 is a diagram schematically depicting a configuration of a laser beam irradiating unit and the like of a laser beam irradiating apparatus according to a modification of the third embodiment. Incidentally, in FIG. 5, FIG. 6, and FIG. 7, description of identical parts to those of the first embodiment, the second embodiment, and the third embodiment will be omitted by identifying the identical parts by the same reference numerals, and as in FIG. 2, polarized components at respective positions of optical paths of the laser beam 21 will be depicted as appropriate.

Incidentally, the laser beam irradiating apparatuses 1 according to the modifications depicted in FIG. 5, FIG. 6, and FIG. 7 do not include the imaging unit 27, 27-1, or 27-2, but image the laser beams 21-1 and 21-2 and irradiate the target object 200 with the resulting laser beams 21-1 and 21-2 by displaying a phase pattern having an imaging function on the display surfaces 251 of the spatial light modulators 25-1 and 25-2 that modulate the optical characteristics of the laser beams 21-1 and 21-2 and emit the resulting laser beams 21-1 and 21-2. Therefore, in the modification depicted in FIG. 5, the imaging unit that images the laser beam 21 synthesized by the second polarization beam splitter 24-2 and irradiates the target object 200 with the resulting laser beam 21 is the imaging function of the first spatial light modulator 25-1 and the imaging function of the second spatial light modulator 25-2. In addition, in the modification depicted in FIG. 6 and FIG. 7, the first imaging unit that images the first laser beam 21-1 emitted from the first spatial light modulator 25-1 and irradiates the target object 200 with the resulting first laser beam 21-1 is the imaging function of the first spatial light modulator 25-1, and the second imaging unit that images the second laser beam 21-2 emitted from the second spatial light modulator 25-2 and irradiates the target object 200 with the resulting second laser beam 21-2 is the imaging function of the second spatial light modulator 25-2. Incidentally, as in the first embodiment, the second embodiment, and the third embodiment, the modifications depicted in FIG. 5, FIG. 6, and FIG. 7 may include the imaging units 27, 27-1, and 27-2. That is, in the present invention, it suffices for at least either the imaging units 27, 27-1, and 27-2 or the spatial light modulators 25-1 and 25-2 to image the laser beams 21, 21-1, and 21-2.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser beam irradiating apparatus for irradiating a target object with a laser beam, the laser beam irradiating apparatus comprising:

a laser oscillator configured to emit the laser beam;

a polarization beam splitter configured to separate polarized components of the laser beam emitted from the laser oscillator into p-polarized light and s-polarized light;

a first spatial light modulator on which one polarized component separated by the polarization beam splitter is made incident, and that is configured to modulate the incident laser beam according to a first phase pattern, and emit the resulting laser beam;

a second spatial light modulator on which another polarized component separated by the polarization beam splitter is made incident, and that is configured to modulate the incident laser beam according to a second phase pattern, and emit the resulting laser beam;

a first imaging unit configured to image the laser beam emitted from the first spatial light modulator, and irradiate the target object with a respective first resulting laser beam; and a second imaging unit configured to image the laser beam emitted from the second spatial light modulator, and irradiate the target object with a respective second resulting laser beam.

2. The laser beam irradiating apparatus according to claim 1, wherein the first imaging unit is an imaging function of the first spatial light modulator, and the second imaging unit is an imaging function of the second spatial light modulator.

3. The laser beam irradiating apparatus according to claim 2, wherein the first spatial light modulator is a liquid crystal on silicon-spatial light modulator (LCOS-SLM) and the second light modulator is a liquid crystal on silicon-spatial light modulator (LCOS-SLM).

4. The laser beam irradiating apparatus according to claim 1, wherein each of the first imaging unit and the second imaging unit is an imaging lens.

5. The laser beam irradiating apparatus according to claim 1, wherein the target object includes a substrate and a plurality of semiconductor chips plurally arranged on the substrate, and a plurality of bumps;

wherein the first imaging unit is configured to irradiate a first set of the semiconductor chips with the resulting laser beam imaged from the first spatial light modulator, wherein bumps are reflowed by the laser beam to connect the first set of semiconductor chips to the substrate; and wherein the second imaging unit is configured to irradiate a second set of the semiconductor chips with the resulting laser beam imaged from the second spatial light modulator, wherein bumps are reflowed by the laser beam to connect the second set of semiconductor chips to the substrate.

6. The laser beam irradiating apparatus according to claim 5, further comprising:

a controller; and a temperature detector communicatively coupled to the controller;

wherein the controller changes the laser power density of the laser beam so as to suppress damage to the semiconductor chips on the basis of a detection result of the temperature detector.

7. The laser beam irradiating apparatus according to claim 5, further comprising:

a pressing member configured to press the target object, wherein the pressing member is formed of a material that transmits the laser beam, and the target object is irradiated with the laser beam through the pressing member.

* * * * *